FOUR LAYER PLANAR SEMICONDUCTOR SWITCH AND METHOD OF MAKING THE SAME

Filed May 19, 1965

INVENTOR.
DONALD S. DIEHL

BY [signature]

ATTORNEY 3,387,192

FOUR LAYER PLANAR SEMICONDUCTOR SWITCH AND METHOD OF MAKING THE SAME

Donald S. Diehl, Philadelphia, Pa., assignor to IRC, Inc., a corporation of Delaware Filed May 19, 1965, Ser. No. 456,919
4 Claims. (Cl. 317—235)

ABSTRACT OF THE DISCLOSURE

A four layer planar semiconductor switch comprising a flat disc of an n-type semiconductor material having a first region of p-type conductivity in one surface of the disc which is smaller in area than the area of the one surface of the disc to provide a p-n junction which extends to the one surface of the disc. A second region of n-type conductivity is provided within the first region and is smaller in area than the area of the first region to provide a second p-n junction which extends to the one surface of the disc. A third region of p-type conductivity is provided in the other surface of the disc and extends across the entire area of the other surface of the disc to provide a third p-n junction which extends to the edges of the disc. A groove is provided in the edge of the disc which extends from the other surface of the disc to a point beyond the third p-n junction. A film of silicon dioxide is provided on the one surface of the disc which extends across the first and second p-n junctions, and a film of silicon dioxide is provided on the surface of the groove and extends across the third p-n junction.

The semiconductor switch is made by forming in one surface of a flat, large wafer of an n-type semiconductor material a plurality of spaced regions of p-type conductivity to provide between each of the regions of the wafer a p-n junction which extends to the one surface of the wafer. At the same time, a region of p-type conductivity is formed in the other surface of the wafer which region extends completely across the other surface of the wafer. Grooves are then formed in the other surface of the wafers with the grooves being of a depth greater than the thickness of the p-type region in the other surface of the wafer and with the groove extending along lines between the spaced p-type regions in the one surface of the wafer so that each of the spaced p-type regions is in an area surrounding the grooves. A separate region of n-type conductivity is then formed in each of the spaced p-type regions in the one surface of the wafer. A film of silicon dioxide is coated on the one surface of the wafer and the surface of the grooves so that the silicon dioxide films extend over the p-n junctions which extend to the coated surfaces. The wafer is then diced along the grooves to divide the wafer into the individual semiconductor switches.

Four layer semiconductor devices, PNPN devices, require that the junctions be passivated to protect the junctions from exposure to the contaminating ambients. Such passivation of the junctions is necessary to minimize leakage current across the junctions which can adversely affect the electrical characteristics of the device.

In a four layer semiconductor device of planar construction, it is the general practice to form two of the layers by a double diffusion into one surface of a n-type silicon disc with the two junctions being brought to the surface of the disc where they are passivated by a silicon oxide masking film. The fourth layer is generally formed by diffusing a p-type impurity into the other surface of the silicon disc with the fourth layer extending completely across the other surface of the disc. To passivate the third junction formed between the fourth layer and the silicon disc, it has been the practice to diffuse a narrow strip of p-type impurity completely through the disc from said one surface to the fourth layer around the edge of the disc. This brings the third junction to the one surface of the disc where it is passivated by the silicon oxide masking film. However, this construction has the disadvantages that to diffuse the narrow strip of p-type impurity completely through the disc requires a long diffusion time which adds to the cost of making the device. Also, the long diffusion time requires the use of very thick silicon oxide masking films which are difficult to etch for further processing of the device.

It is an object of the present invention to provide a novel construction of a planar four layer semiconductor device.

It is another object of the present invention to provide a planar four layer semiconductor device in which two of the junctions are passivated at a surface of the device and the third junction is passivated at the edge of the device.

It is a further object of the present invention to provide a novel method of making four layer semiconductor devices of planar construction.

It is a still further object of the present invention to provide a method of making four layer semiconductor devices of planar construction which is less time-consuming than previously-used methods, and which does not require the use of very thick oxide masking films.

Other objects will appear hereinafter.

For the purpose of illustrating the invention, there is shown in the drawings a form which is presently preferred, it being understood, however, that this invention is not limited to the precise arrangements and instrumentalities shown.

Figures 1, 2, 3, 4, 5, 6:
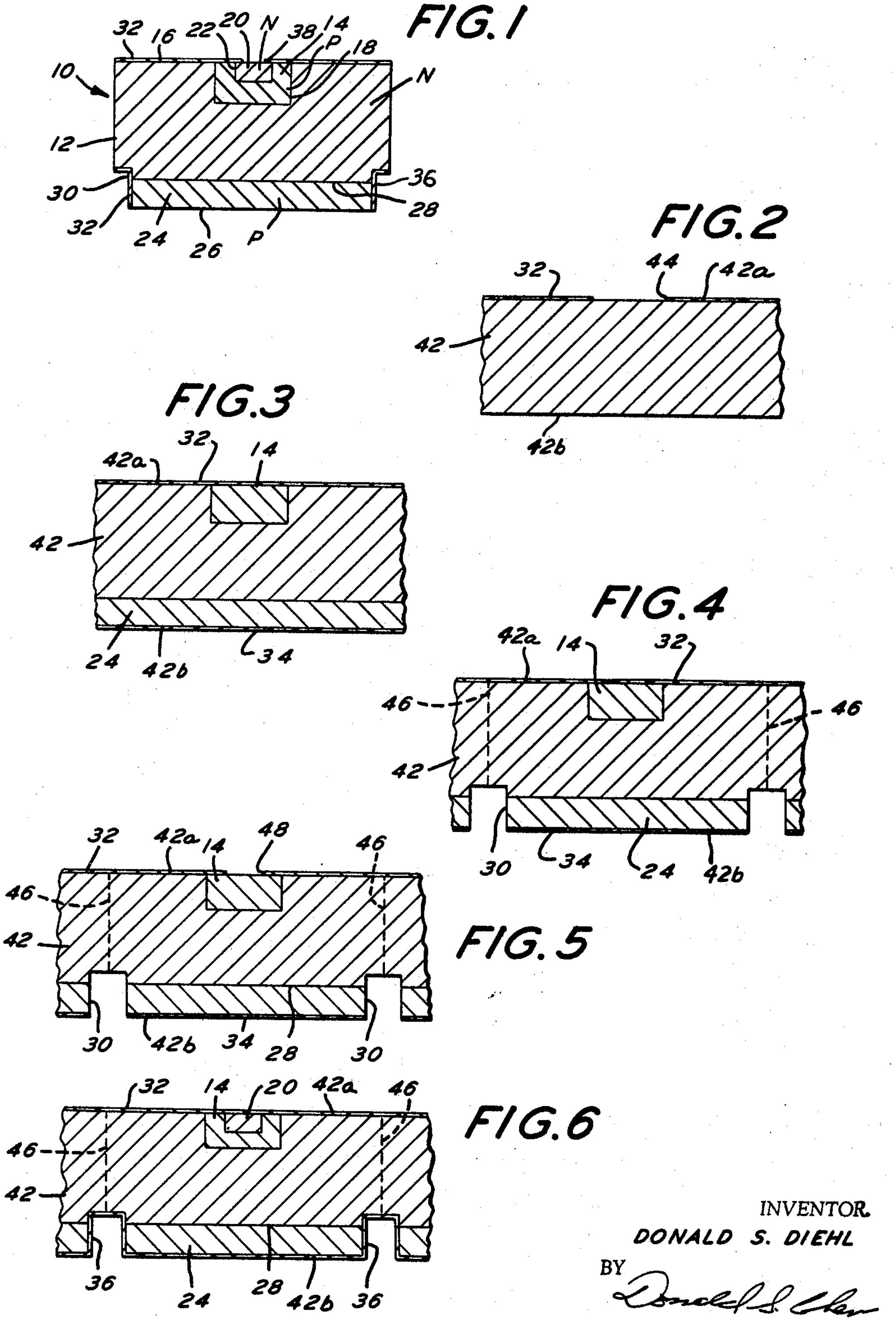
FIGURE 1 is a sectional view of the four layer semiconductor device of the present invention.
FIGURE 2 is a sectional view of a portion of a semiconductor wafer illustrating the first stage of the method of the present invention.
FIGURE 3 is a view similar to FIGURE 2, illustrating the second step of the method of the present invention.
FIGURE 4 is a view similar to FIGURE 3 illustrating the third step of the method of the present invention.
FIGURE 5 is a view similar to FIGURE 4 illustrating the fourth step of the method of the present invention.
FIGURE 6 is a view similar to FIGURE 5, illustrating the fifth step of the method of the present invention.

Referring initially to FIGURE 1, the four layer semiconductor device of the present invention is generally designated as 10. Semiconductor device 10 comprises a disc 12 of n-type semiconductor material, such as silicon. A region 14 of p-type conductivity is provided in the disc 12 at the surface 16 of the disc. The area of the p-type region 14 is smaller than area of the disc surface 16 so as to provide a p-n junction 18 which extends to the disc surface 16. A region 20 of n-type conductivity is provided in the p-type region 14 at the disc surface 16. The area of the n-type region 20 is smaller than the area of the p-type region 14 so as to provide a p-n junction 22 which extends to the disc surface 16. A region 24 of p-type conductivity is provided in the disc 12 at its other surface 26. The p-type region 24 extends completely across the disc surface 36 and provides a p-n junction 28 which extends to the edge of the disc 12. The edge of the disc 12 has a groove 30 therein which extends from the surface 26 of the disc 12 to a point beyond the p-n junction 28.

The disc surface 16 is coated with a film 32 of silicon dioxide. The surface of the groove 30 is also coated with a film 36 of silicon dioxide. The silicon dioxide film 32 extends across the p-n junctions 18 and 22 to passivate the junctions, and the silicon dioxide film 36 extends across the p-n junction 28 to passivate this junction. As shown, the silicon dioxide film 32 is provided with an opening 38 therethrough over the n-type region 20 to permit a terminal to be electrically connected to the n-region. A second terminal can be electrically connected to the p-type region 24. This provides the semiconductor device 10 of the present invention as a four layer diode. If a four layer triode or switching device is desired, the silicon dioxide film 32 is provided with a second opening therethrough over the p-type region 14 to permit a terminal to be electrically connected to the p-type region 14.

To make the four layer semiconductor device 10 of the present invention, the starting material is a flat wafer 42 (FIGURE 2) of the n-type silicon which is many times larger in surface area than the individual semiconductor device 10. One surface 42*a* of the wafer 42 is coated with a film 32 of silicon dioxide. The silicon dioxide film 32 is provided with a plurality of spaced openings 44 therethrough, only one of which is shown. The number of openings 44 provided in the silicon dioxide film 32 depends on the number of the semiconductor devices to be formed in the wafer 42 with one opening 44 being provided for each semiconductor device. The size of each opening 44 corresponds to the area of the p-type region 14 to be formed. The silicon dioxide film 32 can be formed by heating the wafer 42 in an atmosphere containing oxygen and/or water vapor to oxidize the surfaces of the wafer. This forms a silicon dioxide film on the surface 42*b* of the wafer 42 as well as on the surface 42*a* of the wafer. The openings 44 are formed by coating the silicon dioxide films 32 on the wafer surface 42*a* with a suitable resist material. The resist material is coated over the entire silicon dioxide film 32 except the areas where the openings 44 are to be provided. The wafer 42 is then treated with a suitable etching material, such as a mixture of ammonium fluoride, hydrofluoric acid and water, so as to provide the openings 44 and remove all of the silicon dioxide film on the wafer surface 42*b*. This removes all of the silicon dioxide not coated by the resist material.

A p-type donor containing material, such as a boron oxide, is then coated on the exposed portions of the wafer surface 42*a* and on the entire wafer surface 42*b*, and the wafer 42 is heated to diffuse the p-type donor material into the wafer 42. This forms the p-type regions 14 and 24 as shown in FIGURE 3. The diffusion operation is carried out in an atmosphere containing oxygen and/or water so that the exposed surfaces of the wafer 42 are oxidized at the same time that the p-type donor material is diffused into the wafer. As shown in FIGURE 3, this extends the silicon dioxide film 32 over the p-type region 14 and forms the silicon dioxide film 34 over the p-type region 24.

The next step of the method of the present invention is to form the grooves 30 in the surface 42*b* of the wafer 42. The grooves 30 are formed along the junction between adjacent semiconductor devices 10 as indicated by the dash lines 46 (See FIGURE 4) so that each of the semiconductor devices is completely surrounded by the grooves. Two sets of parallel grooves 30 are provided with the grooves in each set being spaced apart and with one set of grooves being perpendicular to the other set. The grooves 30 are formed by coating a resist material over the entire silicon dioxide film 32 and over all of the silicon dioxide film 34 except where the grooves 30 are to be formed. The exposed area of the silicon dioxide film 34 is then removed by means of a suitable etching material, such as that described above, to expose the area of the wafer surface 42*b* thereunder. The exposed area of the wafer surface 42*b* is then removed to a depth slightly beyond the p-n junction 28 forming the grooves 30. This can be accomplished by treating the exposed area of the wafer surface 42*b* with a suitable etching material, such as hydrogen chloride or hydrogen bromide, at a temperature of 1000° C., or a mixture of 10 parts nitric acid, 6 parts acetic acid and 3 parts hydrofluoric acid.

After the grooves 30 are formed, the silicon dioxide film 32 is provided with a separate opening 48 therethrough over each of the p-type regions 14 (See FIGURE 5). The openings 48 are of a size corresponding to the area of the n-type region 20 to be formed in the wafer 42. The openings 48 are formed in the silicon dioxide film 32 in the manner previously described for forming the openings 44. An n-type donor containing material, such as a phosphorous oxide, is then coated on the exposed surfaces of the p-type regions 14, and the wafer 42 is heated to diffuse the n-type donor material into the p-type regions 14 to form the n-type regions 20 (see FIGURE 6). The diffusion process is carried out in an atmosphere containing oxygen and/or water vapors to oxide the exposed surfaces of the wafer 42. As shown in FIGURE 6, this extends the silicon dioxide layer 32 over the n-type region 20, and forms the silicon dioxide film 36 on the surface of the grooves 30 to passivate the p-n junction 28.

The terminal receiving opening 38 is then provided through the silicon dioxide film 32 and the silicon dioxide film 34 is removed in the manner previously described with regard to forming the opening 44. If four layer triodes are being made, a second terminal receiving opening is provided in the silicon dioxide film 32 to the p-type region 14. Generally, the surfaces to which the terminals are to be attached are coated with an electrically conductive metal to facilitate the attachment of the terminals. The wafer 42 is then diced or broken apart along the lines of the grooves 30, as indicated by the dashed lines 46, to separate the individual semiconductor devices 10. This can be achieved by any of the methods well known in the art, such as cutting with a saw or the scribe and break technique.

In the method of the present invention, the etching of the grooves 30 to permit passivation of the p-n junction 28 at the edge of the semiconductor device 10 is a much quicker operation than the process previously used of diffusing a p-type donor material completely through the wafer to permit passivation of the p-n junction at the surface of the wafer. Also, the process of the present invention does not require the use of thick silicon dioxide films so that the various openings formed through the silicon films during the processing of the semiconductor device can be achieved easily and quickly. In addition, the grooves 30 reduce the thickness of the wafer along the lines that the wafer is broken apart into the individual semiconductor devices so as to facilitate the dicing operation.

The present invention may be embodied in other specific forms without departing from the spirit or essential attributes thereof, and accordingly, reference should be made to the appended claims, rather than to the foregoing specification as indicating the scope of the invention.

I claim:

1. A four layer semiconductor device comprising a flat disc of a n-type semiconductor material, a first region of p-type conductivity in one surface of said disc, said first region being of a size smaller in area than the area of said one surface of said disc and forming with said disc a first p-n junction which extends to said one surface of the disc, a second region of n-type conductivity within said first region, said second region being of a size smaller than that of the first region and forming with said first region a second p-n junction which extends to said one surface of the disc, a third region of p-type conductivity in the other surface of said disc, said third region extending completely across the other surface of said disc and forming with said disc a third p-n junction which extends to the edge of the disc, said disc having a groove in its edge which extends from said other surface to beyond the third p-n junction, a film of silicon dioxide on said one surface of said disc and extending across said first and second p-n junctions, and a film of silicon dioxide on the surface of said groove and extending across said third p-n junction.

2. A method of making four layer semiconductor devices comprising the steps of:

forming in one surface of a flat wafer of n-type semiconductor material a plurality of spaced regions of p-type conductivity to provide between each of said regions and the wafer a p-n junction which extends to said one surface of the wafer;

forming in the other surface of said wafer a region of p-type conductivity which extends completely across said other surface of the wafer and provides a p-n junction with said wafer;

forming grooves in the other surface of said wafer of a depth greater than the thickness of the p-type conductivity region in said other surface, said grooves extending along lines between the spaced regions of p-type conductivity on the one surface of said wafer so that each of said spaced regions is in an area of the wafer completely surrounded by said grooves;

forming a separate region of n-type conductivity within each of the spaced regions of p-type conductivity in said one surface of the wafer to provide p-n junctions which extend to said one surface of the wafer;

coating said one surface of said wafer with a film of silicon dioxide with said film extending across the p-n junction which extends to said one surface of the wafer;

coating the surfaces of grooves with a layer of silicon dioxide; and then dicing said wafer along said grooves to divide the wafer into individual semiconductor devices.

3. A method of making four layer semiconductor devices comprising the steps of:

coating one surface of a flat wafer of n-type semiconductor material with a film of silicon dioxide with said film having a plurality of spaced openings therethrough;

diffusing a p-type donor material into the exposed areas of said one surface of the wafer to form in the wafer a plurality of regions of p-type conductivity with a separate p-n junction between each of said regions and the wafer which junctions extend to said one surface of the wafer;

diffusing a p-type donor material into the other surface of the wafer to form a region of p-type conductivity which extends completely across the other surface of the wafer;

coating the exposed areas of said one surface of the wafer and the other surface of the wafer with films of silicon dioxide;

removing strips of the silicon dioxide film on the other surface of the wafer along lines extending between the p-type conductivity regions in the one surface of the wafer;

then forming grooves in the exposed areas of the other surface of the wafer of a depth greater than the thickness of the p-type conductivity region in the other surface of the wafer;

then forming a separate opening in the silicon dioxide film on the one surface of the wafer over each of the p-type conductivity regions in said one surface with the openings being smaller in area than the surface area of the said p-type conductivity regions;

then diffusing a n-type donor material into the exposed areas of the one surface of the wafer to form a region of n-type conductivity in each of said p-type conductivity regions with a p-n junction between said regions which junction extends to the one surface of the wafer;

coating the exposed areas of the one surface of the wafer and the surfaces of the grooves with films of silicon dioxide; and then dicing said wafer along said grooves to divide the wafer into individual semiconductor devices.

4. The method of making four layer semiconductor devices as set forth in claim 3 in which prior to dicing the wafer the steps of removing the film of silicon dioxide from the other surface of the wafer and forming terminal receiving openings in the film of silicon dioxide film on the one surface of the wafer over each of the regions of the n-type conductivity.

References Cited

UNITED STATES PATENTS

| | | | |
|---|---|---|---|
| 2,899,344 | 8/1959 | Atalla et al. | 148—1.5 |
| 3,049,451 | 8/1962 | Carlat et al. | 148—1.5 |
| 3,076,253 | 2/1963 | Cornelison et al. | 29—25.3 |
| 3,105,926 | 10/1963 | Herlet | 317—234 |
| 3,147,152 | 9/1964 | Mendel | 148—1.5 |
| 3,200,468 | 8/1965 | Dahlberg | 29—25.3 |
| 3,209,428 | 10/1965 | Barbaro | 29—25.3 |
| 3,275,906 | 9/1966 | Matsukura | 317—235 |
| 3,312,880 | 4/1967 | Longo et al. | 317—235 |

JOHN W. HUCKERT, *Primary Examiner.*

R. F. SANDLER, *Assistant Examiner.*

UNITED STATES PATENT OFFICE
CERTIFICATE OF CORRECTION

Patent No. 3,387,192 June 4, 1968

Donald S. Diehl

It is certified that error appears in the above identified patent and that said Letters Patent are hereby corrected as shown below:

In the heading to the printed specification, line 6, "IRC, Inc., a corporation of Delaware" should read -- TRW Inc., a corporation of Ohio --.

Signed and sealed this 3rd day of March 1970.

(SEAL)
Attest:

Edward M. Fletcher, Jr.
Attesting Officer

WILLIAM E. SCHUYLER, JR.
Commissioner of Patents